(12) United States Patent
Palmteer

(10) Patent No.: US 6,781,065 B1
(45) Date of Patent: Aug. 24, 2004

(54) SOLDER-COATED ARTICLES USEFUL FOR SUBSTRATE ATTACHMENT

(75) Inventor: William James Palmteer, North Andover, MA (US)

(73) Assignee: The Whitaker Corporation, Wilmington, DE (US)

( * ) Notice: Subject to any disclaimer, the term of this patent is extended or adjusted under 35 U.S.C. 154(b) by 121 days.

(21) Appl. No.: 09/590,406

(22) Filed: Jun. 8, 2000

(51) Int. Cl.[7] .................................................. H05K 1/16
(52) U.S. Cl. ..................................... 174/260; 257/737
(58) Field of Search ........................ 228/180.28, 18.22; 361/768, 770, 771; 174/260, 257; 257/737, 738, 781

(56) References Cited

U.S. PATENT DOCUMENTS

| | | | |
|---|---|---|---|
| 5,108,027 A | | 4/1992 | Warner et al. .............. 228/254 |
| 5,431,328 A | * | 7/1995 | Chang et al. ........... 228/180.22 |
| 5,838,069 A | * | 11/1998 | Itai et al. ..................... 257/766 |
| 5,971,253 A | * | 10/1999 | Gilleo et al. ........... 228/180.22 |
| 6,087,597 A | * | 7/2000 | Shimada et al. ............. 174/263 |
| 6,278,184 B1 | * | 8/2001 | Brofman et al. ............. 257/737 |
| 6,337,445 B1 | * | 1/2002 | Abbott et al. ................ 174/260 |

OTHER PUBLICATIONS

*Copper Coated Glass Microspheres GL–0263, Data Sheet*, MO–SCI Corporation, Rolla, Missouri.

* cited by examiner

*Primary Examiner*—David Nelms
*Assistant Examiner*—Jeremy Norris

(57) ABSTRACT

A solder-coated article is described. The article comprises (1) a dielectric core having a largest dimension ranging from 1 to 1000 microns; (2) a solderable metal layer over the core; and (3) a solder layer over the metal layer. Preferably, the dielectric core is a spherical core of ceramic or glass material that ranges from 25 to 200 microns in diameter. Copper and nickel are preferred materials for the solderable metal layer. The solder is preferably selected from a solder comprising lead and tin and a solder comprising lead and indium, more preferably a 63% Sn–37% Pb solder, a 95% Pb–5% Sn solder, or a 50% Pb–50% In solder. Also described are modified substrates and (solder bonded assemblies) that can be created using such solder-coated articles, as well as a procedure for making the same.

23 Claims, 2 Drawing Sheets

SOLDER-COATED ARTICLES USEFUL FOR SUBSTRATE ATTACHMENT

FIELD OF THE INVENTION

The present invention relates to solder-coated articles useful for substrate attachment processes, including flip-chip attachment processes.

BACKGROUND OF THE INVENTION

Flip-chip solder bonding is a popular means for providing very high density, area interconnections between a first substrate, such as a semiconductor chip, and a second substrate, such as a circuit board. Flip-chip bonding provides very attractive electrical characteristics (low inductance and capacitance) for high-speed electronic devices, and this technique provides very precise alignment and separation of components. Examples of specific applications include flip-chip bonded GaAs and silicon devices for microwave applications. These devices commonly involve a chip component and a substrate component, both of which are provided with mating arrays of solderable metallization pads (solder pads). Either or both of the chip and substrate are provided with solder bumps.

As a specific example, there has recently been an increased interest in the flip-chip attachment of GaAs MMICs in both the commercial and the defense industries.

The flip-chip technology has not only provided the above-noted superior electrical performance, but it also offers a variety of advantages from a manufacturing standpoint including the following:

Flip-chip attachment via solder bumps provides a higher wafer yield and lower cost than backside MMIC processing, for example, because, backside thinning and back via process steps are eliminated.

The die used in connection with flip-chip attachment processes are easier to handle than thinned die, resulting in higher yield.

Die attach (mechanical attachment) and electrical interconnection occur simultaneously, decreasing the required number of manufacturing steps.

Referring now to FIG. 1, an integrated circuit chip 2 and a substrate component 4, both having surfaces with registering arrays of solderable metallization pads 6, 8, are provided. The solderable metallization pads 6 are further provided with solder bumps 10. Referring now to FIG. 2, for bonding, the components 2, 4 are first aligned to within the accuracy required for the solder bumps 10 to contact the corresponding solder pad 8 (e.g., within ½ a pad diameter). The assembly is then raised above the melting point of the selected solder under inert or reducing conditions. The solder wets the solder pads 6, 8 and surface tension forces act to pull the two components into very accurate final alignment. The bonded assembly is then cooled to form a solidly bonded, hybrid device structure.

Conventional processes for forming solder bumps, however, typically involve photolithography, electroplating and wet chemical etching steps. Processes of the this type are not entirely satisfactory for a number of reasons, including (1) the requirement of chemical processing steps, (2) the use of numerous processing steps, and (3) high lead usage, which can lead to higher costs and adverse environmental impact.

SUMMARY OF THE INVENTION

The above and other needs in the prior art are addressed by the present invention. According to an embodiment of the invention, a solder-coated article is provided. The article comprises (1) a dielectric core having a largest dimension (i.e., the longest distance between two points on the surface of the core—for a sphere, the largest dimension is the diameter) ranging from 1 to 1000 microns; (2) a solderable metal layer over the core; and (3) a solder layer over the metal layer. Preferably, the dielectric core is a spherical core of ceramic or glass material that ranges from 25 to 200 microns in diameter. Copper and nickel are preferred materials for the solderable metal layer. The solder is preferably selected from a solder comprising lead and tin and a solder comprising lead and indium, more preferably a 63% Sn–37% Pb solder, a 95% Pb–5% Sn solder, or a 50% Pb–50% In solder.

According to another embodiment of the invention, a modified substrate is provided which comprise (1) a substrate; (2) a metalized pad on the substrate; and (3) a bump feature on the metalized pad comprising (a) a dielectric core; (b) a solderable metal layer over the core; and (c) a solder region contacting at least a portion of the solderable metal layer and at least a portion of the metalized pad. The substrate is preferably a semiconductor substrate, a ceramic substrate or a printed circuit. More preferably, the printed circuit is a printed circuit board or a flexible circuit.

According to another embodiment of the invention, a solder bonded assembly is provided comprising: (1) a first substrate comprising a first solder pad; (2) a second substrate comprising a second solder pad; (3) a dielectric core provided with a solderable metal layer and disposed between the first and second solder pads; and (4) a solder region covering at least a portion of each of (a) the first solder pad, (b) the second solder pad and (c) the solderable metal layer. The first and second substrates are preferably semiconductor substrates, ceramic substrates or printed circuits.

According to yet another embodiment of the invention, a method of providing a modified substrate is set forth. The method comprises: (1) providing a substrate comprising one or more solder pads; and (2) providing one or more bump features on the one or more solder pads, each the bump feature comprising: (a) a dielectric core; (b) a solderable metal layer over the core; and (c) a solder region covering at least a portion of the solderable metal layer and at least a portion of the solder pad. The bump feature is preferably provided by a method comprising: (1) providing one or more solder-coated articles comprising: (a) a dielectric core, (b) a solderable metal layer over the core, and (c) a solder layer over the metal layer; (2) placing the one or more solder-coated articles on the one or more solder pads; and (3) applying sufficient heat to melt the solder layer. More preferably, the dielectric core is a spherical dielectric core and, the one or more solder-coated articles are placed on the one or more solder pads by a method comprising: (1) providing a pick-up assembly comprising a block with one or more holes in communication with a vacuum, the one or more holes arranged in a configuration that corresponds to positions of the one or more solder pads; (2) placing the pick-up assembly into contact with a group of the solder-coated articles; (3) applying a vacuum such that each of the one or more holes is filled with a solder-coated article; (4) aligning the one or more solder-coated articles with the one or more solder pads; and (5) discontinuing the vacuum such that the one or more solder-coated articles are released on the one or more solder pads.

One advantage of the present invention is that solder bumps can be provided on a substrate with minimal chemical processing steps.

Another advantage is low lead use. Hence, costs and adverse environmental impact are reduced.

These and other embodiments and advantages of the present invention will become immediately apparent to those of ordinary skill in the art upon reading the description and claims to follow.

DETAILED DESCRIPTION OF THE INVENTION

Several preferred embodiments of the invention now will be more fully described, with reference to accompanying drawings where appropriate. This invention may, however, be embodied in different forms and should not be construed as limited to the embodiments set forth herein.

Figure 1:
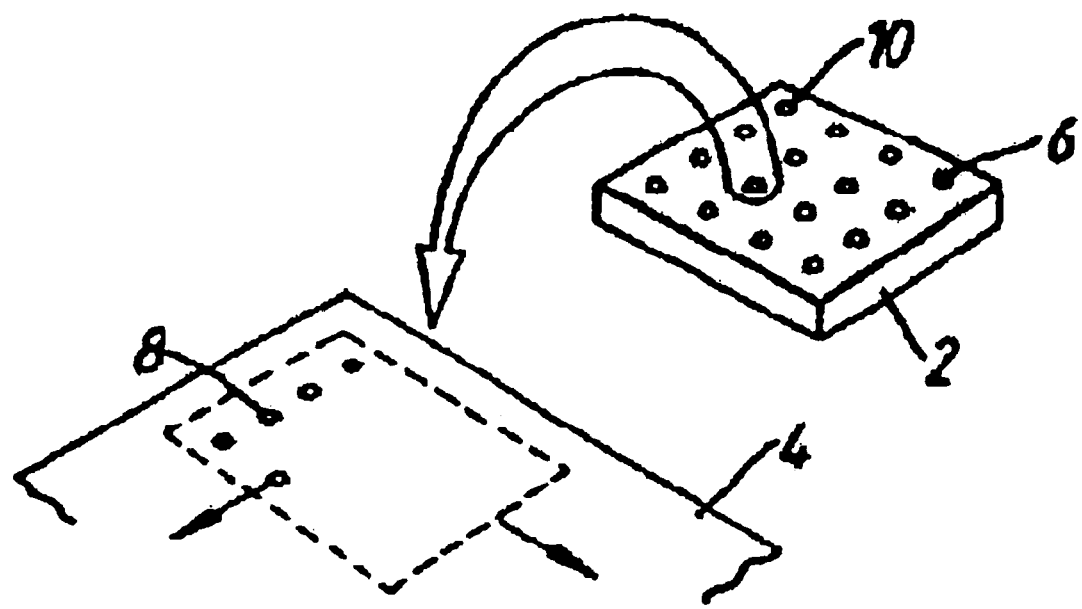
FIG. 1 and FIG. 2 are schematic diagrams illustrating a flip-chip attachment method known in the prior art.
Figure 2:
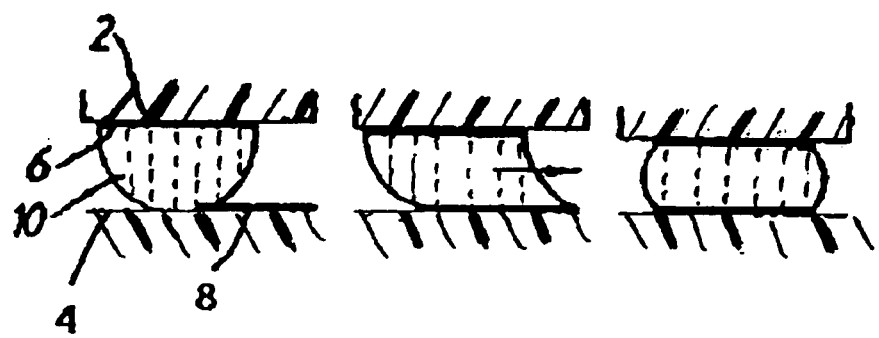
Figure 3:
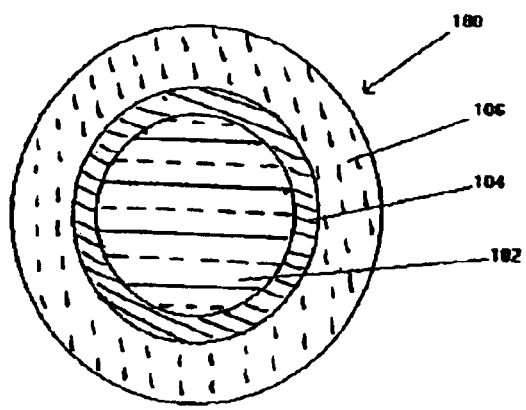
FIG. 3 is cross-sectional view of a solder-coated article according to an embodiment of the present invention.

In connection with one aspect of the present invention, novel solder-coated articles are provided. Referring to FIG. 3, it can be seen that such solder-coated articles 100 contain a dielectric core 102. The dielectric core can have either a solid or hollow (air filled) center. The dielectric core 102 is provided with a metal layer 104, which in turn is provided with a solder layer 106 over the metal layer 104.

The dielectric core 102 can be made of essentially any dielectric material having a melting point above that of the solder layer 106 and is preferably substantially non-deformable. Preferred dielectric materials for the core 102 include ceramic materials and glass materials. Ceramic materials include alumina and sapphire. Such materials are commonly available for abrasive purposes, including sandblasting. Glass materials include quartz, alkali silicates, borosilicates, alkali-lime silicates, alumina silicates, alkali-borosilicates, and alumina alkali borosilicates. Since a dielectric core is used, where such solder-coated articles are used to establish electrical connection between substrates, it is contemplated that slightly higher operating frequencies may be achieved as compared to prior art solid-metal solder bumps.

The dielectric core 102 can be of any shape and dimension suitable for the intended application. Preferably the dielectric core 102 is spherical in shape, but other shapes, both regular and irregular, are contemplated. The largest dimension of the dielectric core (i.e., the diameter in the case of a spherical core) will preferably range from 1 to 1000 microns in diameter. When used to provide a solder bump for present day flip-chip soldering processes, the largest dimension of the dielectric core 102 preferably ranges from 25–200 microns, and more preferably from 50 to 100 microns.

The metal layer 104 can be formed from essentially any solderable metal. Copper and nickel are preferred, however other noble metals such as gold, platinum, palladium or silver may be used. The coating need only be thick enough to provide good coverage of the dielectric cores 102. A thickness of 0.1 to 1 micron or less is generally sufficient. The metal layer 104 can be applied to the dielectric cores 102 by any method known in the art, such as barrel electroplating techniques. Alternatively, prefabricated glass microspheres coated with copper are available, for example, as product number GL-0263 from Mo-Sci Corporation, Rolla, Mo. in diameters ranging from 25 to 200 microns with coating thicknesses of 0.1 to 1 microns. Hollow microspheres are also available from Mo-Sci.

The material used for the solder layer 106 will depend upon the end application and can readily be determined by those of ordinary skill in the art. For example, the following solders are frequently used in connection with flip-chip mounting and are appropriate for practice with the present invention: 63% Sn/37% Pb, 95% Pb/5% Sn, 50% Pb/50% In. The solder layer 106 can be applied over the metal layer 104 using techniques known in the art, such as barrel electroplating.

The thickness of the solder layer 106 will also depend upon the end application and can be readily determined by those of ordinary skill in the art. Where used as substitutes for prior art solder bumps, the thickness of the solder layer 106 is preferably sufficient to achieve, after solder reflow: (a) good solder coverage of solder pads on the substrates to be attached (b) good solder coverage of the metal layer 104 and (c) good solder continuity at all points between the substrates (such that good electrical connection between the substrates should be achieved). The thickness of the solder layer will also depend on the amount, if any, of solder that is provided on the solder pads of the substrate to be attached.

Where used to physically and electrically attach one substrate to another, as a first step, the solder-coated articles of the invention are typically attached to one or more solder pads on a first-substrate.

The base material of the substrate is typically an elemental semiconductor, such as silicon or germanium, or a compound semiconductor, such as III–V and II–VI semiconductors (e.g., gallium arsenide).

The semiconductor substrate is preferably supplied with one or more metalized pads, which are well known in the art. Metalized pad configurations typically used in industry comprise one or more barrier layers in contact with the semiconductor substrate with a solderable metal layer over the barrier layer(s). Commonly used, solderable metal layers include copper (typically with oxide inhibitors provided), gold, platinum and so forth. Numerous barrier layers are known in the art. As a specific example a titanium layer can be applied to the substrate followed by a platinum layer to provide a dual-layer barrier. An example of one common solder pad is Ti(550° Å)/Pt(1000 Å)/Au(22000 Å).

The metalized pads (which, again, may include both a barrier layer or layers and a solderable metal layer) are provided using any method known in the art, such as sputtering.

The semiconductor substrate is also commonly provided with one or more additional dielectric layers adjacent to the solder pads, which dielectric layers act to passivate the semiconductor and act as a barrier to moisture. A common example is a combination of nitride (e.g., silicon nitride) and benzocyclobutene (BCB) layers.

The solder-coated articles of the present invention can be attached to the metalized pads of the first substrate simply by bringing the solder-coated articles in contact with the solder pads, followed by heating the same to above the melting point of the solder. The solder then flows, bringing molten solder into contact with the metalized pads, after which the assembly is cooled. Since the melting point of the core and the metal layer are greater than that of the solder, the inner dielectric core maintains its shape during this process, along with the solderable metal layer.

A specific example in which numerous solder-coated articles are attached to a semiconductor substrate follows. First, 68+/−5 micron copper coated glass spheres (e.g., product number GL-263 from Mo-Sci Corp.) Are obtained and coated by barrel electroplating with a solder layer comprising 63% Sn and 37% Pb to provide solder-coated articles. A wafer with solder pads (in this example, a silicon wafer comprising Ti(550° Å)/Pt(1000 Å)/Au(2000 Å) solder pads as well as nitride and benzocyclobutene (BCB) passivation/moisture layers) is preheated to a temperature of about 100° C. The solder-coated articles are then placed into an open container forming a monolayer of spheres in the container. Adjacent to this container is another shallow container containing a specified volume of flux. A dual head assembly is then provided, which contains (1) a pick-up tool and (2) a bed of small round cylinders. The pick-up tool consists of a Teflon/stainless steel sheet machined with 0.002-inch (i.e, approximately 50 micron) diameter through-holes. The location and number of the holes will match location on the wafer where the solder spheres are to be attached (i.e., the solderable pads). The bed of cylinders is arrayed in the same fashion so as to contact the solderable pads on the wafer. Equipment of this type is well known in the art of BGA (ball grid arrays) for placement of solder balls on printed circuit boards.

The dual head assembly operates such that (1) the bed of cylinders is lowered into the container of flux, contacting the surface of the flux and (2) at the same time, a vacuum is applied to the pick-up tool as it is dipped into the container of spheres, causing each hole of the pick-up tool to be filled with a single solder-coated article Using a pattern recognition system, the head with the flux-coated bed of cylinders in aligned over the wafer. Upon a slight vertical motion, the tip of each cylinder contacts each solderable pad on the wafer, leaving a certain volume of flux on the pad. Once complete, this head is raised and the pick-up head with the spheres is then located directly over the flux coated solder pads on the wafer. The pick-up head is then lowered gently until the base of each solder coated sphere contacts the flux. The vacuum in the pick-up head is then shut off and the pick-up head is raised, leaving the spheres on the flux coated solder pads on the wafer. The wafer is then shuttled through a tunnel oven set with the appropriate reflow temperature profile.

Figure 4:
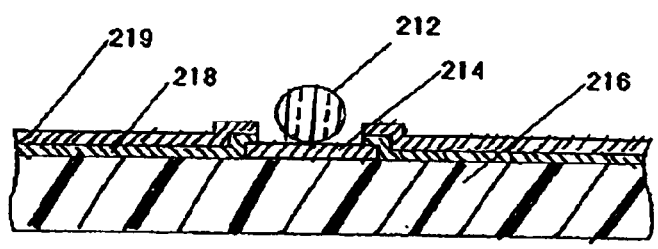
FIG. 4 is a partial cross-sectional view of a portion of a semiconductor substrate modified with an attached solder-coated article, according to an embodiment of the present invention.

The resulting article is shown in FIG. 4 prior to the final step of melting the solder and attaching the solder-coated articles (the flux is not shown). FIG. 4 depicts solder-coated article 212, solder pad 214, semiconductor substrate 216, nitride layer 218 and BCB layer 219. In this figure, the solder pad 214, semiconductor substrate 216, nitride layer 218 and BCB layer 219 are shown in cross-section.

Once the solder-coated articles are attached to the solder pads of the first substrate, as a second step, this entire assembly is brought into contact with a second substrate. The second substrate can be, for example, a semiconductor substrate such as those listed above, a ceramic substrate such as alumina, BeO, LTCC (Low Temp. Cofired Ceramic, or a printed circuit such as FR-4, BT (bismaleimide triazine) or a flexible circuit The second substrate has solder pads corresponding in location to the metalized pads and solder-coated articles on the first substrate. In one preferred embodiment, the solder pads on the second substrate are provided with a layer of solder like that found on the solder-coated articles.

Figure 5:
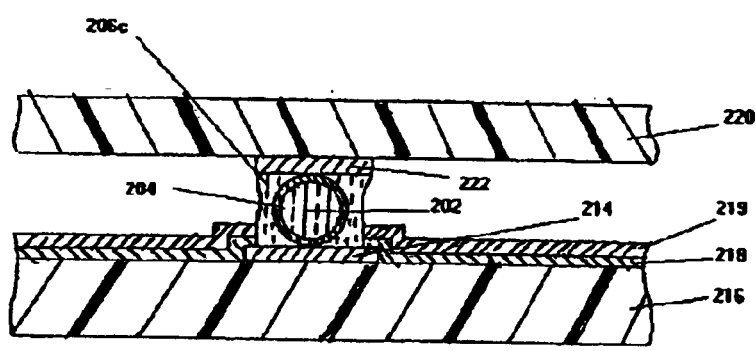
FIG. 5 is a cross-sectional view of a portion of an assembly whereby a semiconductor substrate has been attached to a printed circuit substrate using a solder-coated article according to an embodiment of the present invention.

For attachment, the entire assembly is heated to above the melting point of the solder on the solder-coated articles and the solder, if any, on the solder pads of the second substrate. Consequently, the solder reflows, resulting in physical attachment and electrical connection between the substrates. The resulting assembly is shown in FIG. 5, which is a cross-sectional view of the semiconductor substrate 216, nitride layer 218, BCB layer 219 and solder pad 214 of the assembly of FIG. 4 after attachment to a circuit board 220 having solder pad 222. Between bonding pads 214 and 222 are shown cross-sectional views of the dielectric core 202 and metal layer 204 of the solder-coated article. The solder layer of the solder-coated article has been subjected to solder reflow producing, along with any solder previously provided on bonding pad 222, a solder region 206c (in the form of a column), which attaches and electrically connects solder pad 214 to solder pad 222.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A solder-coated article comprising:
    a substantially non-deformable dielectric core having a largest dimension ranging from 1 to 1000 microns; a solderable metal layer completely surrounding said core; and
    a solder layer completely surrounding said metal layer.

2. The solder-coated article of claim 1, wherein said core is a ceramic core.

3. The solder-coated article of claim 1, wherein said core is a glass core.

4. The solder-coated article of claim 1, wherein said core is a spherical core.

5. The solder-coated article of claim 4, wherein said core ranges from 25 to 200 microns in diameter.

6. The solder-coated article of claim 1, wherein said solderable metal layer is selected from copper and nickel.

7. The solder-coated article of claim 1, wherein said solder is selected from (a) a solder comprising lead and tin and (b) a solder comprising lead and indium.

8. The solder-coated article of claim 7, wherein said solder layer is selected from a 63% Sn/37% Pb solder, a 95% Pb/5% Sn solder, and a 50% Pb/50% In solder.

9. A modified substrate comprising:
    a substrate;
    a metalized pad on said substrate; and
    a bump feature on said metalized pad, said bump feature comprising a substantially non-deformable dielectric core; a solderable metal layer completely surrounding said core; and a solder region completely surrounding said solderable metal layer and contacting at least a portion of said metalized pad.

10. The modified substrate claim 9, wherein said substrate is a semiconductor substrate.

11. The modified substrate of claim 9, wherein said substrate is a ceramic substrate.

12. The modified substrate of claim 9, wherein said substrate is a printed circuit.

13. The modified substrate of claim 12, wherein said printed circuit is selected from a printed circuit board and a flexible circuit.

14. The modified substrate of claim 9, wherein said core is a ceramic core.

15. The modified substrate of claim 9, wherein said core is a glass core.

16. A solder bonded assembly comprising:

a first substrate comprising a first solder pad;

a second substrate comprising a second solder pad;

a bump feature comprising a substantially non-deformable dielectric core, a solderable metal layer completely surrounding said core and a solder layer completely surrounding said solderable metal layer, said bump feature being disposed between said first and second solder pads; and said solder layer covering at least a portion of each of (a) said first solder pad, (b) and said second solder pad.

17. The solder bonded assembly of claim 16, wherein said first and second substrates are selected from the group consisting of a semiconductor substrate, a ceramic substrate and a printed circuit.

18. The solder bonded assembly of claim 16, wherein said first substrate is a semiconductor substrate and said second substrate is a printed circuit.

19. The solder bonded assembly of claim 16, wherein said core is a ceramic core.

20. The solder bonded assembly of claim 16, wherein said core is a glass core.

21. A solder-coated article comprising:

a dielectric core having a largest dimension ranging from 1 to 1000 microns;

a solderable metal layer completely surrounding said core; and a solder layer completely surrounding said metal layer;

wherein said dielectric core has a melting temperature higher than said solder layer.

22. A modified substrate comprising:

a substrate;

a metalized pad on said substrate; and a bump feature on said metalized pad, said bump feature comprising a dielectric core; a solderable metal layer completely surrounding said core; and a solder region completely surrounding said solderable metal layer and contacting at least a portion of said metalized pad;

wherein said dielectric core has a melting temperature higher than said solderable metal layer.

23. A solder bonded assembly comprising:

a first substrate comprising a first solder pad;

a second substrate comprising a second solder pad;

a bump feature comprising a dielectric core a solderable metal layer completely surrounding said core and a solder layer completely surrounding said solderable metal layer, said bump feature being disposed between said first and second solder pads; and said solder layer covering at least a portion of each of (a) said first solder pad, (b) and said second solder pad;

wherein said dielectric core has a melting temperature higher than said solderable metal layer.

* * * * *